United States Patent
Peterson

(10) Patent No.: US 7,855,888 B2
(45) Date of Patent: Dec. 21, 2010

(54) COOLING MANIFOLD ASSEMBLY

(75) Inventor: Eric C. Peterson, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 165 days.

(21) Appl. No.: 12/352,907

(22) Filed: Jan. 13, 2009

(65) Prior Publication Data

US 2010/0175852 A1 Jul. 15, 2010

(51) Int. Cl.
*H05K 7/20* (2006.01)
*F28F 7/00* (2006.01)
*F28D 15/00* (2006.01)

(52) U.S. Cl. ............... 361/699; 165/80.4; 165/104.33; 361/700; 361/719

(58) Field of Classification Search ............... 361/699, 361/700
See application file for complete search history.

(56) References Cited

U.S. PATENT DOCUMENTS

| | | | |
|---|---|---|---|
| 5,161,089 A * | 11/1992 | Chu et al. .................. 361/703 |
| 6,349,035 B1 * | 2/2002 | Koenen ...................... 361/719 |
| 7,372,702 B2 * | 5/2008 | Gauche et al. .............. 361/719 |
| 7,450,385 B1 * | 11/2008 | Campbell et al. ........... 361/699 |
| 7,558,662 B2 * | 7/2009 | Yamaguchi et al. ........... 701/70 |
| 7,646,603 B2 * | 1/2010 | Bard et al. .................. 361/696 |
| 2005/0243517 A1 * | 11/2005 | Malone et al. .............. 361/699 |
| 2006/0232945 A1 * | 10/2006 | Chu et al. .................... 361/724 |
| 2008/0018212 A1 * | 1/2008 | Spearing et al. ............. 312/236 |
| 2008/0259567 A1 * | 10/2008 | Campbell et al. ........... 361/699 |
| 2008/0264613 A1 * | 10/2008 | Chu ...................... 165/104.33 |
| 2009/0294106 A1 * | 12/2009 | Flotta et al. ............ 165/104.33 |
| 2010/0085712 A1 * | 4/2010 | Hrehor et al. ............... 361/699 |

* cited by examiner

*Primary Examiner*—Gregory D Thompson
(74) *Attorney, Agent, or Firm*—Steven L. Webb

(57) ABSTRACT

A cooling apparatus comprising a cooling manifold assembly is disclosed. The cooling manifold assembly comprises a manifold inlet end cap, a manifold outlet end cap and at least one cooling manifold. Cooling fluid flows into the manifold inlet end cap, through the cooling manifold, and the exits from the manifold outlet end cap. The cooling manifold is configured to rotate from a closed position into an open position without breaking a fluid seal between the manifold inlet end cap, the cooling manifold, and the manifold outlet end cap.

15 Claims, 4 Drawing Sheets

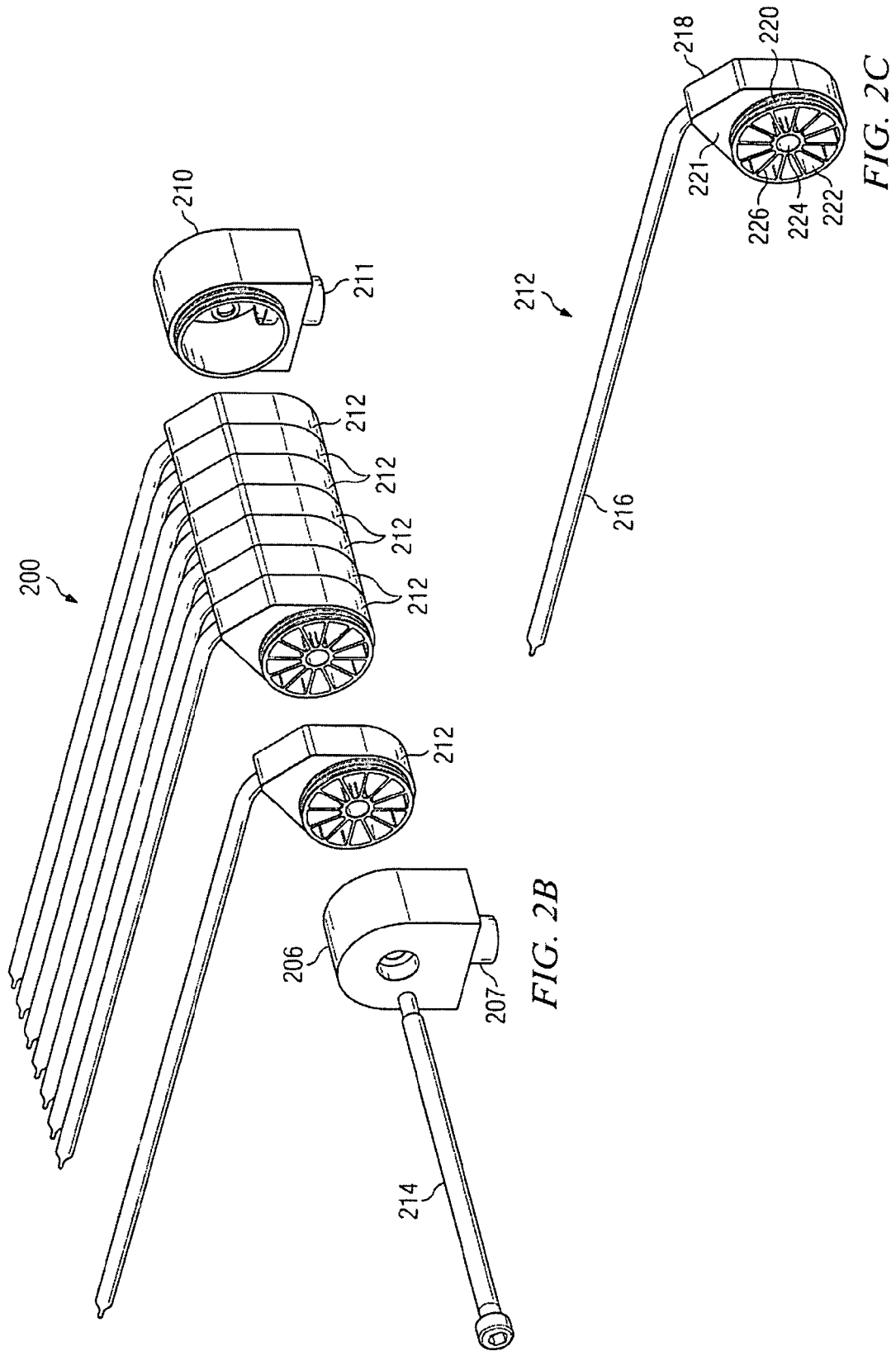

COOLING MANIFOLD ASSEMBLY

BACKGROUND

Computer data centers or computer servers generate large amounts of heat. Most data centers or servers currently use air to cool the computers or the components in the computer systems. Because of the increasing density of the components in the computer systems, the heat density of the computer systems and data centers is increasing.

The increase in heat density requires either higher air flow rates, cooler air, or both to adequately cool the system components. Cooling air to a temperature below the ambient temperature requires a refrigeration system. Refrigeration systems typically use large amounts of power. In fact, the refrigeration systems for a data center may use more than 50% of the total power required by the data center.

Some data centers use liquids as the heat transfer medium instead of, or in addition to, air. Liquids typically have a much higher heat carrying capacity than air. Unfortunately using liquids as the heat transfer medium can make it difficult to modify or replace components in the computer systems because the coolant lines may need to be opened and then re-sealed.

BRIEF DESCRIPTION OF THE DRAWINGS

FIG. 2B is an exploded isometric view of cooling manifold assembly 200 in an example embodiment of the invention.

FIG. 2C is an isometric view of a single cooling manifold 212 in an example embodiment of the invention.

DETAILED DESCRIPTION

FIGS. 1A-3 and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

Figure 1A:
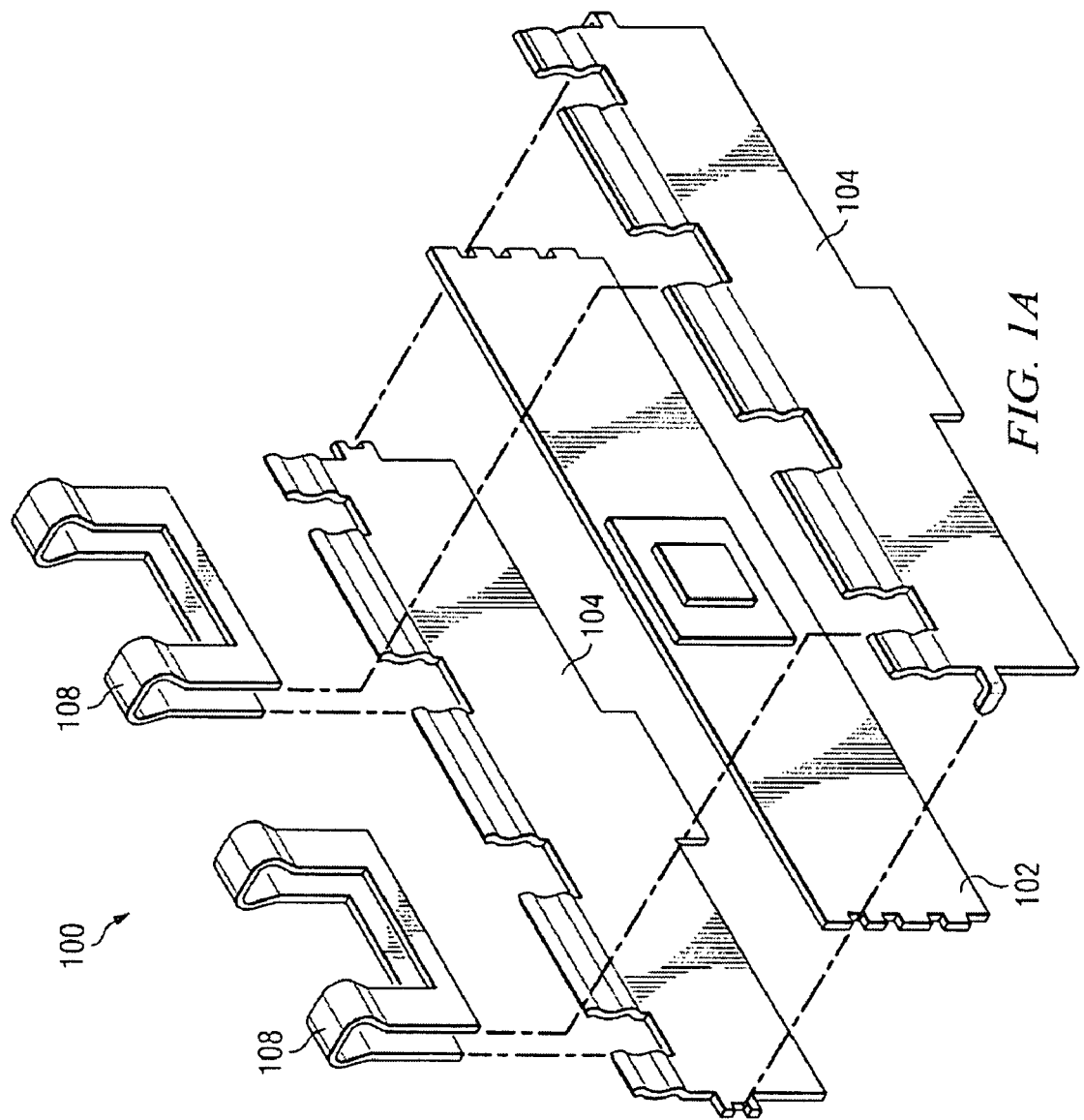
FIG. 1A is an exploded isometric view of a component assembly 100 in an example embodiment of the invention.

FIG. 1A is an exploded isometric view of a component assembly 100 in an example embodiment of the invention. Component assembly 100 comprises a component board 102, two heat spreaders 104, and two clips 108. Component board 102 may comprise a dual in-line memory module (DIMM), an application specific integrated circuit (ASIC) mounted to a PC board, or any other type of electronic component mounted to a PC board that requires cooling. Heat spreaders 104 may be a plate formed to contact the top surfaces of the components mounted onto component board 102. The two heat spreaders 104 may be mirror images of each other, may be the same part rotated 180 degrees with respect to each other or may have different shapes to match differently shaped components mounted on the two sides of component board 102.

Figure 1B:
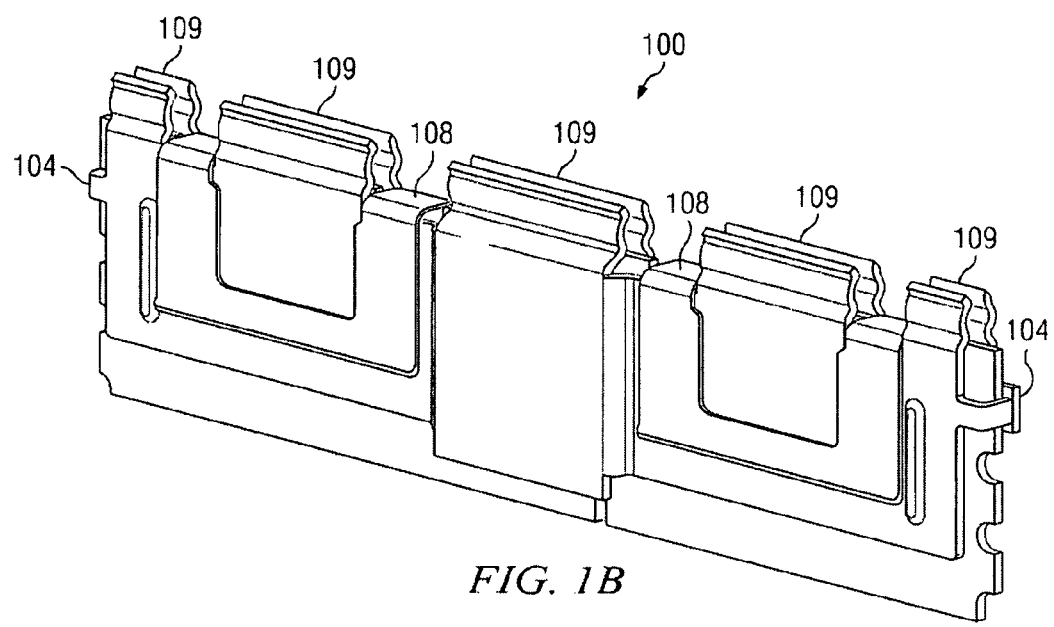
FIG. 1B is an isometric view of a component assembly 100 in an example embodiment of the invention.

FIG. 1B is an isometric view of a component assembly 100 in an example embodiment of the invention. In operation, the two heat spreaders 104 are held against the components mounted on the front and/or back face of component board 102 by clips 108. Clips are shown in this example embodiment, but any suitable method may be used to hold heat spreaders 104 in place. One or more heat pipe snaps 109 are formed along the top edge of heat spreaders 104.

A thermal interface material such as grease may be used to increase the thermal coupling between the components mounted onto the component board 102 and the heat spreaders 104. In another example embodiment of the invention, a vapor chamber can be added to the heat spreader to increase the thermal efficiency. The vapor chamber may be located between the heat spreader and the thermal interface material, or may be in direct contact with the components mounted on the component board.

Figure 2A:
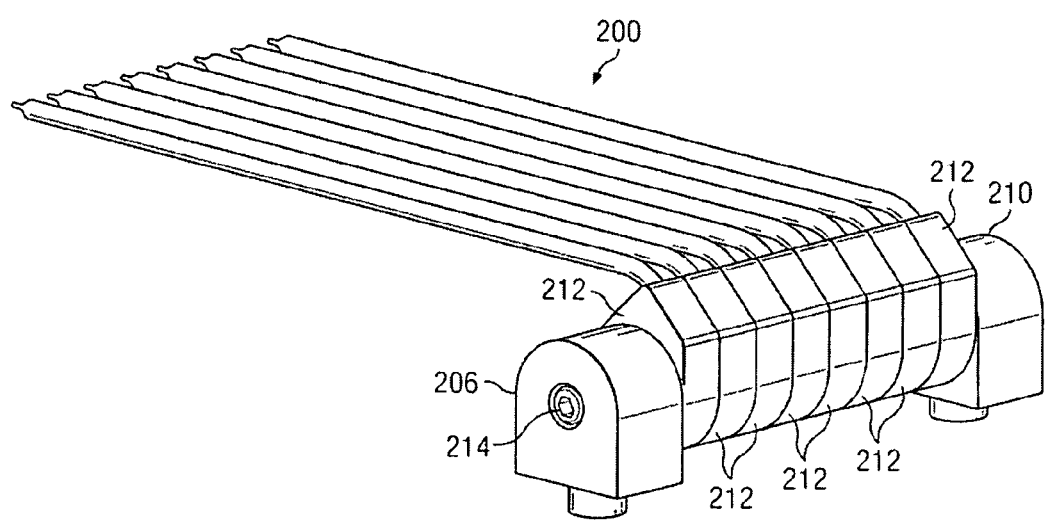
FIG. 2A is an isometric view of a cooling manifold assembly 200 in an example embodiment of the invention.

FIG. 2A is an isometric view of a cooling manifold assembly 200 in an example embodiment of the invention. Cooling manifold assembly 200 comprises manifold inlet end cap 206, manifold outlet end cap 210, screw 214, and a plurality of cooling manifolds 212. Manifold inlet end cap 206 is at one end of cooling manifold assembly 200. Manifold outlet end cap 210 is at the other end of cooling manifold assembly 200. The plurality of cooling manifolds 212 are captured between manifold inlet end cap 206 and manifold outlet end cap 210 and held in place by screw 214.

FIG. 2B is an exploded isometric view of cooling manifold assembly 200 in an example embodiment of the invention. Cooling manifold assembly 200 comprises manifold inlet end cap 206, manifold outlet end cap 210, screw 214, and a plurality of cooling manifolds 212. Screw 214 fits through a hole formed in manifold inlet end cap 206, through a hole formed in each of the plurality of cooling manifolds 212, and into a threaded hole in manifold outlet end cap 210, thereby capturing the plurality of cooling manifolds in-between the two end caps (206 and 210). A washer or O-ring may be used to seal the gap between the screw and the manifold inlet end cap 206. Each of the plurality of cooling manifolds 212 are configured to rotate, from an open position to a closed position, around the axis formed by screw 214. In another example embodiment of the invention, an external clamp may be used to hold the assembly together instead of screw 214. The clamp is coupled to a first side of the manifold inlet end cap, and coupled to a first side of the manifold outlet end cap, the clamp applying a force between the manifold inlet end cap and the manifold outlet end cap, thereby capturing the at least one cooling manifold between the manifold inlet end cap and the manifold outlet end cap.

Fluid inlet port 207 is formed in the bottom of manifold inlet end cap 206 and coupled to a fluid cavity formed in the manifold inlet end cap 206. Fluid outlet port 211 is formed in the bottom of manifold outlet end cap 210 and coupled to a fluid cavity formed in the manifold outlet end cap 210. In operation, a cooling fluid supply line will be coupled to the fluid inlet port 207 and a cooling fluid return line will be coupled to the fluid outlet port 211. In another example embodiment of the invention, the fluid inlet port and the fluid outlet port may be formed into the side or end of the manifold inlet end cap 206 and manifold outlet end cap 210, respectively.

FIG. 2C is an isometric view of a single cooling manifold 212 in an example embodiment of the invention. Cooling manifold 212 comprises manifold body 218, sealing device 220, and heat pipe 216. A hole 224 is formed in the center of manifold body 218. The hole 224 passes through from a front face 221 of manifold body 218 to a back face of manifold body 218. Ribs 226 radiate out from hole 224 and connect with the outer part of manifold body 218. A plurality of fluid passageways 222 are formed between the ribs 226 where the fluid passageways run from the front face 221 of manifold body 218 to the back face of manifold body 218. The manifold body 218 is shaped to accept the heat pipe 216. The heat pipe 216 may be attached to the manifold body 218 by a press fit, epoxy, glue, solder, or the like.

A circular shoulder is formed on the front face 221 of manifold body 218, concentric with hole 224. The plurality of fluid passageways 226 are located inside the circular shoulder. The sealing device 220 is mounted onto the circular shoulder. A corresponding circular depression is formed into the back side of manifold body 218 and configured to mate with the circular shoulder of another manifold body 218. The manifold inlet end cap 206 also has a corresponding circular depression configured to mate with the circular shoulder of a manifold body 218. The manifold outlet end cap 210 has a circular shoulder configured to mate with a corresponding circular depression in the back side of a manifold body 218. The cooling manifolds are configured to rotate around the axis formed by the circular shoulders and there mating circular depressions.

In another example embodiment of the invention, the sealing device may be mounted in the circular depression of the manifold body 218 instead of being mounted on the circular shoulder of the manifold body 218. In one example embodiment of the invention, the scaling device may be an O-ring, a washer, grease, or the like. In another example embodiment of the invention, the manifold body may be fabricated such that a scaling device is not required between each of the cooling manifolds.

In another example embodiment of the invention, the screw 214 may be replaced with a shoulder screw that acts as an axle, allowing each of the cooling manifolds to rotate about the shoulder of the screw. In this example embodiment of the invention, the front and back mating surfaces of the cooling manifolds and the mating surfaces of the inlet and outlet manifolds may be flat.

In another example embodiment of the invention, heat pipe 216 may be replaced with two thinner heat pipes having a springy material placed in-between the two heat pipes, for example a foam. This would allow the two heat pipes to be squeezed together to aid in snapping the heat pipes into the snaps in the top of the component assemblies.

Figure 3:
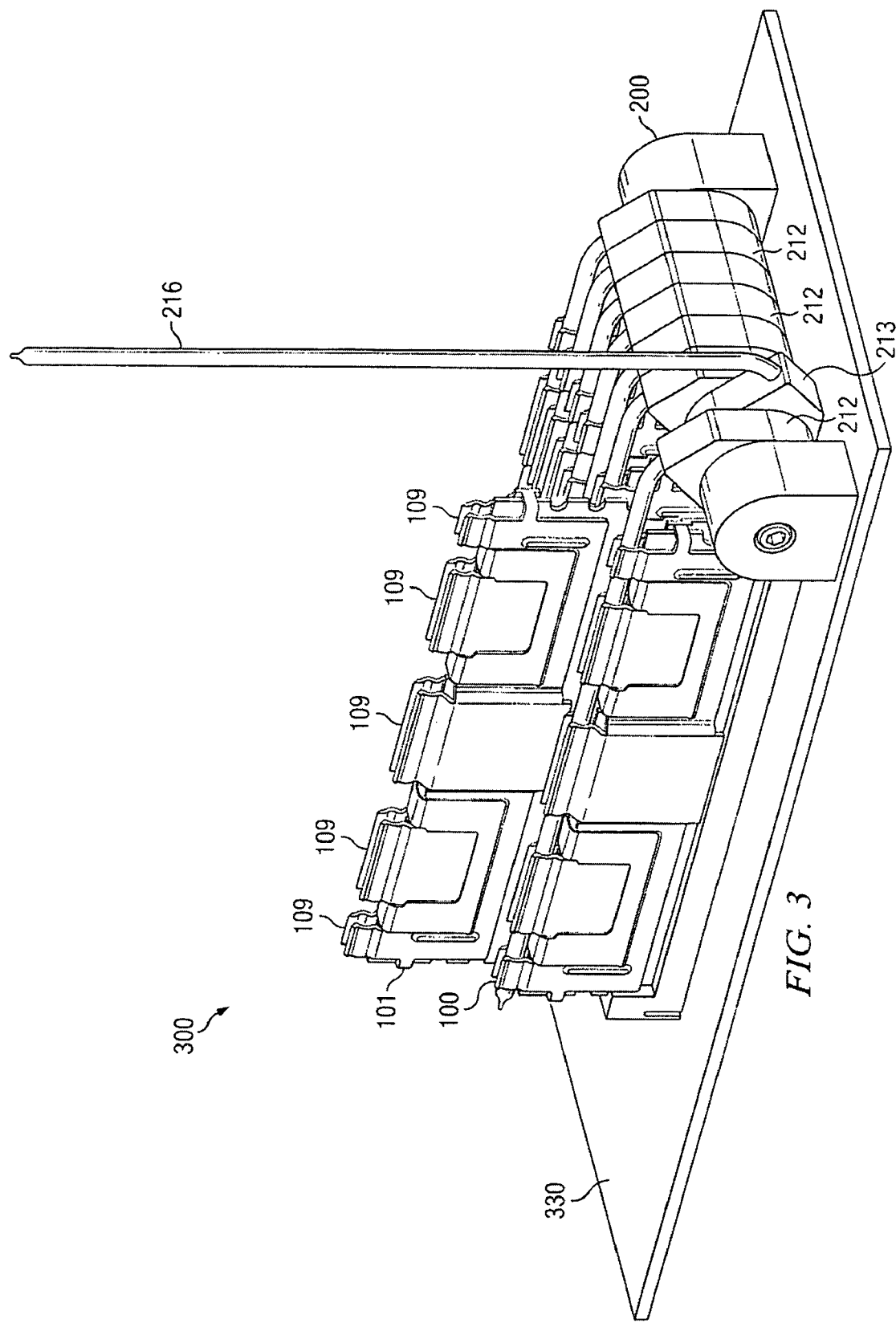
FIG. 3 is an isometric view of a board assembly 300 in an example embodiment of the invention.

FIG. 3 is an isometric view of a board assembly 300 in an example embodiment of the invention. Board assembly 300 comprises printed circuit (PC) board 330, cooling manifold assembly 200, and a plurality of component assemblies 100. In one example embodiment of the invention, cooling manifold 200 is mounted onto PC board 330. In other example embodiments, cooling manifold 200 may be mounted adjacent to PC board 330. The plurality of component assemblies 100 are removably coupled to, and electrically connected with, PC board 330.

Component assembly 101 is shown as it is being inserted into PC board 330. All the other component assemblies 100 are shown already mounted onto PC board 330. Cooling manifold 213 is shown rotated into the open position. All the other cooling manifolds 212 are shown rotated into the closed position. As component assembly 101 is lowered into PC board 330, the lower edge of component assembly 101 couples to, and makes electrical contact with, PC board 330. Once component assembly 101 is in place, cooling manifold 213 can be rotated into the closed position. When cooling manifold is rotated into the closed position, heat pipe 216 snaps into the plurality of heat pipe snaps 109. A thermal interface material such as grease may be used to increase the thermal coupling between the heat pipe 216 and the heat pipe snaps 109.

A cooling fluid supply line (not shown) is coupled to the cooling fluid inlet port 207 formed in manifold inlet end cap 206. A cooling fluid return line (not shown) is coupled to the cooling fluid exit port 211 formed in manifold outlet end cap 210. In operation, fluid flows from cooling fluid inlet port 207, through manifold inlet end cap 206, through fluid channels 222 in each of the cooling manifolds, into manifold outlet end cap 210, and then exits through cooling fluid exit port 211. The fluid removes heat from each of the plurality of cooling manifolds 212.

Heat from the components mounted onto the PC board 102, transfers into heat spreaders 104, and then into heat pipes 216. The heat then flows from the heat pipes 216 into cooling manifolds 212. The fluid flowing through cooling manifolds 212 removes the heat from the cooling manifolds 212. The heat is then transferred out of the system through the cooling fluid return lines. The cooling fluid supply lines and the cooling fluid return lines may be coupled to a heat exchanger, a refrigerator, a chiller, or the like. The cooling fluid may be conditioned to ambient temperature or to below ambient temperature.

Because each of the plurality of cooling manifolds 212 rotate between an open and a closed position, component assemblies 100 can be added or removed while the fluid cooling system remains sealed. This allows a close coupling between the fluid cooling system and the components to be cooled. The fluid cooling system also remains sealed when the computer board assembly 300 is not fully loaded with some component assemblies 100 not present in the computer board assembly 300. In one example embodiment of the invention a failed component can be replaced or an additional component can be added without opening the scaled fluid cooling units. When a failed component is detected, if the component is not hot swappable, the board assembly 300 is powered down. The cooling manifold 212 coupled to the failed component are rotated from the closed position into the open position. The component assembly 100 containing the failed component is removed from the board assembly 300. A replacement component assembly 100 is inserted into the open location. The cooling manifold 212 is then rotated back into the closed position. During this process, the fluid cooling system remains sealed and may remain operational.

What is claimed is:

1. A cooling apparatus, comprising:
 a cooling manifold assembly, comprising:
  a manifold inlet end cap having an inlet body forming a fluid cavity, the inlet body forming an inlet port coupled to the fluid cavity;
  a manifold outlet end cap having an outlet body forming a fluid cavity, the outlet body forming an outlet port coupled to the fluid cavity;
  at least one cooling manifold wherein the at least one cooling manifold comprises;
   a manifold body having a front face and a back face;
   at least one fluid passageway entering the front face of the manifold body and exiting the back face of the manifold body;
   a first heat pipe attached to the manifold body;
  wherein the at least one cooling manifold is captured between the manifold inlet end cap and the manifold outlet end cap and the fluid passageway entering the front face of the manifold body is coupled to the fluid cavity in the inlet body and the fluid passageway exiting the back face of the cooling manifold is coupled to the fluid cavity in the outlet body, whereby the cooling manifold is configured to be rotated, with respect to the inlet and outlet end caps, between an open position and a closed position.

2. The cooling apparatus of claim 1, wherein the at least one cooling manifold further comprises:
 a circular shoulder formed into the front face of the manifold body where the at least one fluid passageway is located inside the circular shoulder, the circular shoulder having an axis perpendicular to the center of the circular shoulder; and a circular depression formed into the back face of the manifold body where the at least one fluid passageway is located inside the circular depression and where the circular depression is formed on the axis, and wherein the cooling manifold rotates about the axis when rotated from the open position to the closed position.

3. The cooling apparatus of claim 2, wherein the at least one cooling manifold further comprises:
a sealing device located on the circular shoulder.

4. The cooling apparatus of claim 1, wherein the at least one cooling manifold further comprises:
a cylindrical hole formed into the manifold body and passing from the front face of the manifold body out through the back face of the manifold body, the cylindrical hole having an axis running along a length of the cylindrical hole, wherein the cooling manifold rotates about the axis when rotated from the open position to the closed position.

5. The cooling apparatus of claim 1, further comprising:
a screw passing though a hole formed in the manifold inlet end cap, and passing through a hole formed in the manifold body of the at least one cooling manifold, and entering a threaded hole formed in the manifold outlet end cap, thereby capturing the at least one cooling manifold between the manifold inlet end cap and the manifold outlet end cap.

6. The cooling apparatus of claim 1, further comprising:
a clamp coupled to a first side of the manifold inlet end cap, and coupled to a first side of the manifold outlet end cap, the clamp applying a force between the manifold inlet end cap and the manifold outlet end cap, thereby capturing the at least one cooling manifold between the manifold inlet end cap and the manifold outlet end cap.

7. The cooling apparatus of claim 1, further comprising:
a plurality of component assemblies wherein each component assembly comprises:
a component PC board with at least one component mounted on a front face of the component PC board;
a first heat spreader comprising a plate having a top side and a front face, where the front face is held against a top side of the at least one component, the first heat spreader forming heat pipe snaps along the top side of the plate;
a main PC board having a top side, wherein the plurality of component assemblies are removably coupled to the top side of the main PC board, and where the cooling manifold assembly is mounted in a location such that the heat pipe in the at least one cooling manifold snaps into the heat pipe snaps in one of the plurality of component assemblies when the cooling manifold is rotated into the closed position.

8. The apparatus of claim 7, wherein at least one clip is used to mount the first heat spreader against the at least one component.

9. The apparatus of claim 7, further comprising:
a second heat spreader comprising a plate having a top side mounted against the component PC board on the opposite side from the first heat spreader, the second heat spreader forming heat pipe snaps along the top side of the plate.

10. The apparatus of claim 7, wherein a thermal interface material is placed between the front face of the first heat spreader and the top side of the at least one component.

11. The apparatus of claim 7, further comprising:
a chilling unit having a cooling fluid supply line and cooling fluid return line, wherein the chilling unit supplies chilled cooling fluid into the cooling fluid supply line and retrieves the cooling fluid from the cooling fluid return line, and where the cooling fluid supply line is coupled to the inlet port and the cooling fluid return line is coupled to the outlet port.

12. The apparatus of claim 1, wherein a second heat pipe is placed in a side-by-side configuration with the first heat pipe with a springy material placed in-between the first and second heat pipes.

13. A method for replacing a failed components in a computer system, comprising:
determining the location of a failed component assembly;
rotating a cooling manifold from a closed position into an open position while a fluid cooling system coupled to a cooling apparatus remains scaled, wherein a heat pipe attached to the cooling manifold contacts the failed component assembly when the cooling manifold is in the closed position, and the heat pipe does not contact the failed component when the cooling manifold is in the open position;
removing the failed component assembly;
inserting a replacement component assembly in place of the failed component assembly;
rotating the cooling manifold from the open position into the closed position whereby the heat pipe contacts the replacement component assembly when the cooling manifold is in the closed position.

14. The method of claim 13, wherein the failed component is hot swappable and a PC board assembly containing the failed component remains powered up as the replacement component is inserted.

15. A cooling apparatus, comprising:
a cooling manifold assembly, comprising:
a manifold inlet end cap having an inlet body forming a fluid cavity, the inlet body forming an inlet port coupled to the fluid cavity;
a manifold outlet end cap having an outlet body forming a fluid cavity, the outlet body forming an outlet port coupled to the fluid cavity;
a plurality of cooling manifolds wherein each of the plurality of cooling manifold comprises;
a manifold body having a front face and a back face;
a plurality of fluid passageways entering the front face of the manifold body and exiting the back face of the manifold body whereby the plurality of fluid passageways of a first one of the plurality of cooling manifolds is configured to mate with the plurality of fluid passageways of a second one of the plurality of cooling manifolds;
a heat pipe attached to the manifold body;
a means for clamping the plurality of cooling manifolds between the manifold inlet end cap and the manifold outlet end cap whereby the plurality of fluid passageways entering the front face of a first one of the plurality of manifold bodies is coupled to the fluid cavity in the inlet body and the plurality of fluid passageways exiting the back face of a second one of the plurality of manifold bodies is coupled to the fluid cavity in the outlet body, and each of the plurality of the cooling manifolds is configured to be rotated, with respect to the inlet and outlet end caps, between an open position and a closed position.

* * * * *

UNITED STATES PATENT AND TRADEMARK OFFICE
CERTIFICATE OF CORRECTION

| | | |
|---|---|---|
| PATENT NO. | : 7,855,888 B2 | Page 1 of 1 |
| APPLICATION NO. | : 12/352907 | |
| DATED | : December 21, 2010 | |
| INVENTOR(S) | : Eric C. Peterson | |

It is certified that error appears in the above-identified patent and that said Letters Patent is hereby corrected as shown below:

In column 5, line 22, in Claim 5, delete "though" and insert -- through --, therefor.

In column 6, line 13, in Claim 13, delete "components" and insert -- component --, therefor.

In column 6, line 18, in Claim 13, delete "scaled," and insert -- sealed, --, therefor.

Signed and Sealed this
Twelfth Day of April, 2011

David J. Kappos
*Director of the United States Patent and Trademark Office*